United States Patent
Sakuarai et al.

(10) Patent No.: US 7,343,857 B2
(45) Date of Patent: Mar. 18, 2008

(54) IMPRINT APPARATUS AND METHOD FOR IMPRINTING

(75) Inventors: Masatoshi Sakuarai, Tokyo (JP); Akira Kikitsu, Yokohama (JP); Naoko Kihara, Matsudo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 222 days.

(21) Appl. No.: 10/952,743

(22) Filed: Sep. 30, 2004

(65) Prior Publication Data

US 2005/0284320 A1 Dec. 29, 2005

(30) Foreign Application Priority Data

Sep. 30, 2003 (JP) .......................... P2003-342067

(51) Int. Cl.
*B41F 33/00* (2006.01)

(52) U.S. Cl. .................. 101/483; 101/363; 977/877; 977/888

(58) Field of Classification Search ................ 977/887, 977/888; 101/9, 368, 463.1, 483, 3.1, 32, 101/16, 28, 84, 103; 264/132; 369/283
See application file for complete search history.

(56) References Cited

U.S. PATENT DOCUMENTS

| | | | | |
|---|---|---|---|---|
| 4,965,454 A * | 10/1990 | Yamauchi et al. | ......... | 250/372 |
| 5,937,758 A * | 8/1999 | Maracas et al. | ........... | 101/327 |
| 6,107,007 A * | 8/2000 | Ohmi et al. | ................ | 430/325 |
| 6,510,129 B1 * | 1/2003 | Hirokane et al. | ........ | 369/275.4 |
| 6,671,034 B1 * | 12/2003 | Hatakeyama et al. | ......... | 355/67 |
| 6,748,865 B2 | 6/2004 | Sakurai et al. | | |
| 6,943,117 B2 * | 9/2005 | Jeong et al. | ................ | 438/694 |
| 6,987,627 B1 * | 1/2006 | Gauzner et al. | .............. | 360/17 |
| 2001/0046644 A1 * | 11/2001 | Ukachi et al. | ........... | 430/281.1 |
| 2003/0234449 A1 * | 12/2003 | Aratani et al. | ............. | 257/758 |
| 2004/0149687 A1 * | 8/2004 | Choi et al. | .................... | 216/40 |

FOREIGN PATENT DOCUMENTS

| | | | |
|---|---|---|---|
| JP | 04372742 | * | 12/1992 |
| JP | 2000-113530 | | 4/2000 |
| JP | 2002-251801 | | 9/2002 |
| JP | 2003-157520 | | 5/2003 |
| JP | 2003-272998 | | 9/2003 |
| WO | WO 03/031096 A2 | | 4/2003 |

* cited by examiner

*Primary Examiner*—Daniel J. Colilla
*Assistant Examiner*—Marissa Ferguson-Samreth
(74) *Attorney, Agent, or Firm*—Oblon, Spivak, McClelland, Maier & Neustadt, P.C.

(57) ABSTRACT

An imprint apparatus configured such that it can press a laminate structure in which a magnetic film and a resist film are sequentially laminated on a substrate. The imprint apparatus includes a first press plate configured to mount the laminate structure, a second press plate adapted for sandwiching the laminate structure, a stamper placed on a surface of the second press plate, and has projections and recesses configured to be transferred onto the resist film, and a light source configured to dispose on the same plane as the laminate structure, and is oriented so that the light source can shine the resist film.

8 Claims, 12 Drawing Sheets

IMPRINT APPARATUS AND METHOD FOR IMPRINTING

CROSS REFERENCE TO RELATED APPLICATIONS

This application is based upon and claims the benefit of priority from the prior Japanese Patent Application No. P2003-342067, filed on Sep. 30, 2003; the entire contents of which are incorporated herein by reference.

BACKGROUND OF THE INVENTION

1. Field of the Invention

The present invention relates to an imprint technique used for manufacturing information recording apparatuses, and particularly to an imprint apparatus and a method for imprinting for the processing of magnetic recording media.

2. Description of the Related Art

In recent years, information recording apparatuses used in general purpose computers or the like have dealt with high capacity data including audio, video and the like, and the recording capacities thereof have thus been increased. With regard to the magnetic recording medium of hard disks and the like serving information recording apparatuses, "patterned media" has been considered favorable. In this patterned media, in order to increase the recording capacity, a magnetic layer on the medium's surface is physically patterned so that tracks or recording bits are physically isolated from each other. The recording density of the patterned media is expected to be 500 gigabit/square inch (Gbpsi), and the period of neighboring recording bits is about 30 nm or smaller. A magnetic recording medium at the above size cannot be fabricated by using earlier photolithography due to limits on the wavelength of light. It is possible to microfabricate the magnetic recording medium in the above size by using electron beam lithography, focused ion beam lithography or the like. However, poor throughput becomes a problem.

Therefore, imprinting is employed, where a resist film applied onto a magnetic layer is physically pressed by using a stamper made from a master-processing disk produced in nanoscale by electron beam lithography or the like. Thus, a pattern of projections and recesses on the surface of the stamper is transferred onto the resist film. Thereafter, etching is performed using the pattern of projections and recesses on the resist film as a mask so that the magnetic layer is patterned.

Imprinting mainly includes "2P method", "hot embossing method", and "high pressure pressing method" at atmospheric pressure and room temperature. First, in 2P method, ultraviolet (UV) curing liquid resist is applied onto a substrate to be thicker than the size of the distortion of the substrate, and is pressed by a transparent stamper made of quartz or the like. Thereafter, UV light is emitted from behind the stamper's surface of projections and recesses so that the resist on the substrate is cured. By doing so, the resist in contact with the stamper's surface is also cured. Thus a resist film onto which the projections and recesses of the stamper's surface are transferred is obtained after the stamper is removed.

For hot embossing method, a non-transparent stamper made of metal or the like is prepared. Resist applied onto a substrate is pressed by the stamper, and the substrate, resist and stamper are heated to the glass transition temperature of the resist or higher while they are pressed. The resist sandwiched between the substrate and stamper thus becomes soft and the shape of the stamper's surface is transferred onto the resist. Thereafter, the substrate, resist and stamper are cooled while being pressed. When the substrate, resist and stamper are at or below the glass transition temperature, the stamper is removed. Thus, projections and recesses on the stamper's surface are transferred onto the resist film.

For high pressure pressing method at atmospheric pressure and room temperature, a non-transparent stamper made of metal or the like is prepared. Resist having the lowest possible glass transition temperature is applied onto a substrate. The resist is then pressed by the imprint stamper at a pressure of 10 MPa or higher. The favorable glass transition temperature of the resist is 50° C. or lower. This low glass transition temperature enables high pressure pressing method even at room temperature, and thereby projections and recesses on the stamper's surface are transferred onto the resist film.

It is difficult, with imprinting, to uniformly press a large area because of the distortions of the substrate and the stamper, or the like. In 2P method described earlier, a thick resist film is used. Therefore, projections and recesses on the stamper's surface can be transferred onto the resist film regardless of the distortion of the substrate. However, the distortions of both the stamper and the surface of the substrate do not sufficiently offset one another. Hence, the distortions eventually emerge as film thickness variations of the resist film sandwiched between the substrate and the stamper.

In hot embossing method, the shape of the resist surface after imprinting is stable, since resist is hard when it has cooled down to the glass transition temperature or lower. However, heating and cooling processes are added, causing poor throughput. In addition, the problem of irregular imprinting caused by the distortions of the substrate and stamper or the like remains unsolved.

In high pressure pressing method at atmospheric pressure and room temperature, distortions of the substrate and stamper are corrected by high pressure pressing method, enabling uniform imprinting of a large area. However, since the resist is deformed at room temperature, distortion of the resist's surface after imprinting occurs over time. Therefore, a material having not only characteristics of low glass transition temperature but also UV curing characteristics is used for the resist, and a UV curing process is performed on the resist surface after imprinting in order to suppress deformation of the resist's surface over time. However, since the gradual deformation of the resist's surface begins immediately after imprinting, the shape of resist surface will have already changed by the time the UV curing process is performed. The resist can be cured while pressing if a stamper made of a transparent material such as quartz can be used like 2P method. However, such transparent materials have problems with strength when being pressed under a high pressure and thus cannot be used.

SUMMARY OF THE INVENTION

An object of the present invention is to provide a imprint apparatus being able to fabricate with high throughput the magnetic recording medium having the patterned media.

An aspect of the present invention inheres in an imprint apparatus configured such that it can press a laminate structure in which a magnetic film and a resist film are sequentially laminated on a substrate including a first press plate configured to mount the laminate structure, a second press plate facing the first press plate adapted for sandwiching the laminate structure with the first press plate, a stamper placed on a surface of the second press plate facing the first press plate, and has projections and recesses configured to be transferred onto the resist film, and a light source configured to dispose on the same plane as the laminate structure, and is oriented so that the light source can shine the resist film.

Another aspect of the present invention inheres in a method for imprinting including mounting a laminate structure having a magnetic film, a resist film and a substrate on a first press plate, placing a stamper on a surface of the second press plate facing the resist film, the stamper has projections and recesses, transferring a pattern of the projections and recesses of the stamper onto the laminate structure by pressing the laminate structure, curing the resist film by emitting UV light onto the resist film from the side of the laminate structure during the press, and obtaining a magnetic recording media having a patterned media by etching the magnetic film using the resist film as a mask.

DETAILED DESCRIPTION OF THE INVENTION

Figure 1:
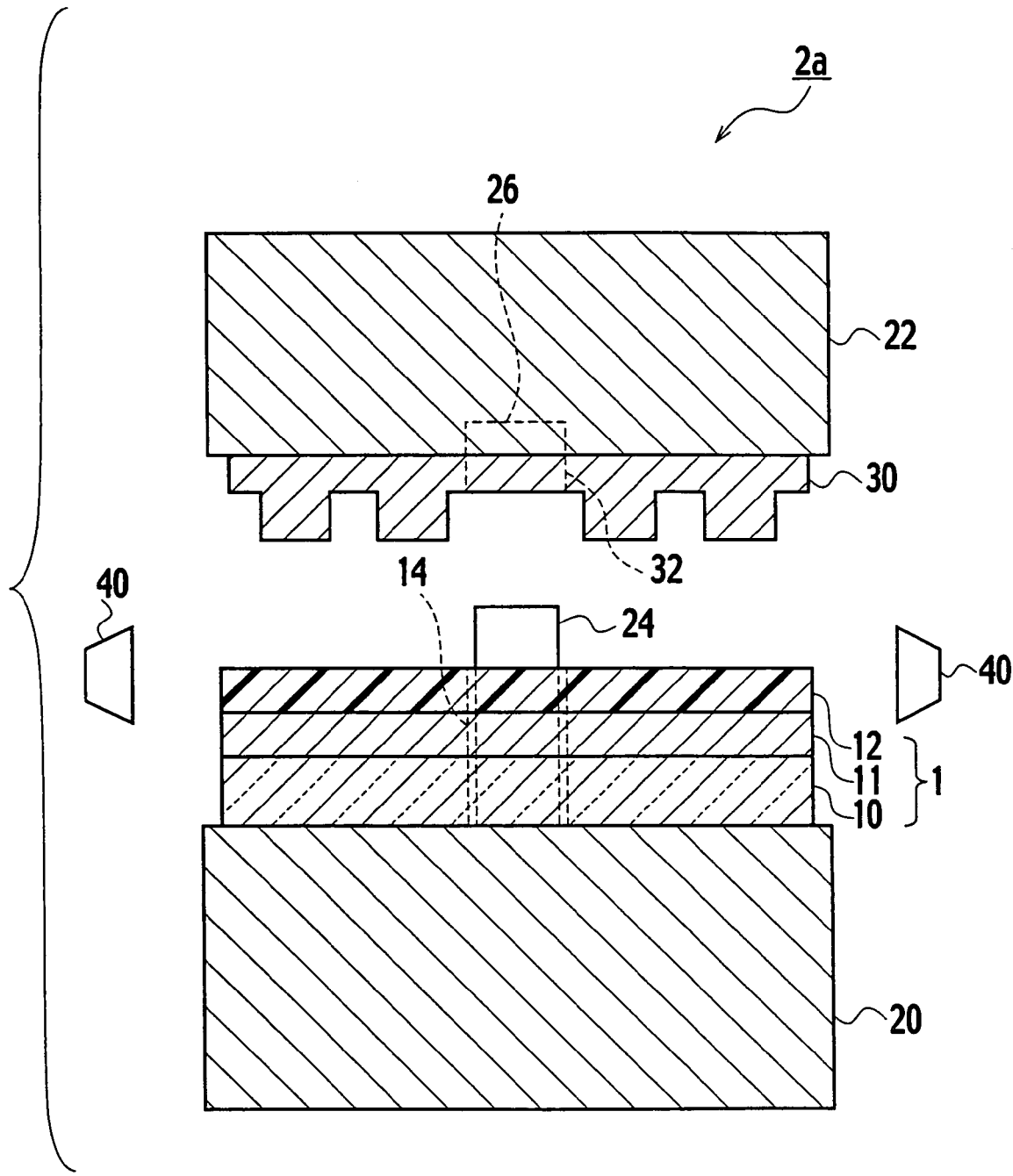
FIG. 1 is a schematic sectional view showing an imprint apparatus according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set forth such as specific signal values, etc. to provide a thorough understanding of the present invention. However, it will be obvious to those skilled in the art that the present invention may be practiced without such specific details.

First Embodiment

As shown in FIG. 1, an imprint apparatus 2a according to a first embodiment of the present invention includes a first press plate 20 onto which a laminate structure 1 is mounted. In the laminate structure 1, a magnetic film 11 and a resist film 12 are sequentially laminated on a substrate 10. The imprint apparatus 2a also includes a second press plate 22 facing the first press plate 20 and sandwiching the laminate structure 1 with the first press plate 20, a stamper 30 placed on a surface of the second press plate 22 facing the first press plate 20, and having projections and recesses to be transferred onto the resist film 12, and a light source 40, that surrounds and is on the same plane as, the laminate structure 1, and is oriented toward the resist film 12.

The size (diameter) of the laminate structure 1 is generally about 20 mm, 46 mm, 65 mm, 89 mm or the like. The substrate 10 is made of a high strength aluminum alloy, hardened glass or the like enables a thin-plate structure and has excellent impact resistance. The substrate 10 is doughnut-shaped with a through hole 14 opened in the center. The surface of the substrate 10 contacting the first press plate 20, and the surface of the substrate 10 providing the magnetic film 11 are parallel to each other. A material with large magnetocrystalline anisotropy is used for the magnetic film 11 in order to prevent thermal fluctuations of magnetization accompanied by the thinning of the film. Further, a material used for the magnetic film 11 reduces a medium noise caused by microstructure, is chemically stable, and has a high mechanical strength. Specifically, a material such as barium ferrite ($BaFe_{12}O_{19}$), an iron-platinum (Fe—Pt) alloy, and a cobalt-platinum (Co—Pt) alloy is used for the magnetic film 11. It is preferred that novolak resin based photoresist or the like are cured by being illuminated with UV light, and are used for the resist film 12.

Figure 2:
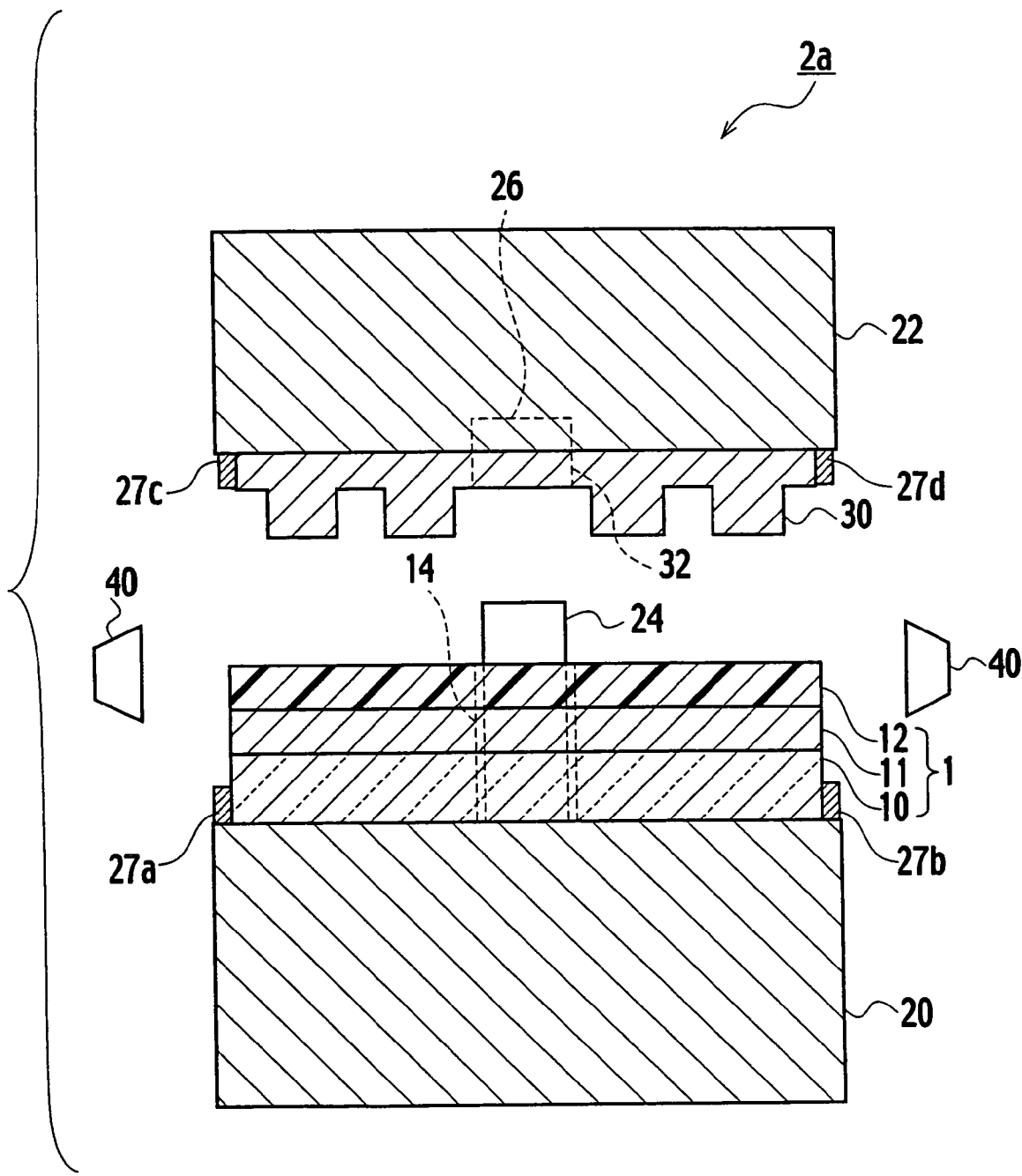
FIG. 2 is another schematic sectional view showing an imprint apparatus according to the first embodiment of the present invention.
Figure 3:
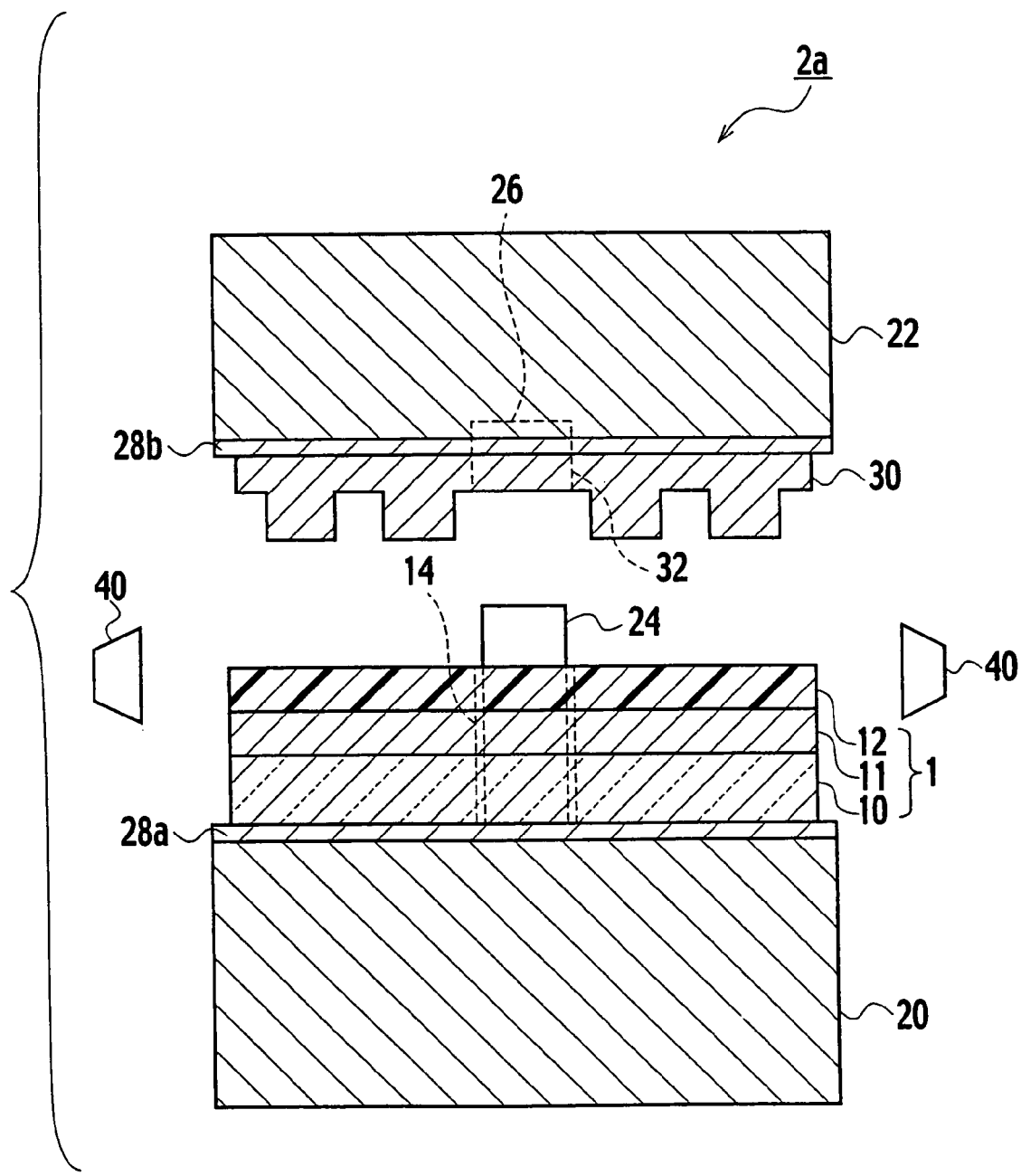
FIG. 3 is an additional schematic sectional view showing an imprint apparatus according to the first embodiment of the present invention.

The top surface of the first press plate 20 mounting the substrate 10 is a level plane. At the center of the top surface of the first press plate 20, an alignment column 24 is provided for aligning the positions of the stamper 30 and the laminate structure 1. The bottom surface of the second press plate 22 is parallel to the top surface of the first press plate 20. There is a first fitting hole 26 at the center of the bottom surface of the second press plate 22. The first fitting hole 26 fits with the alignment column 24 of the first press plate 20 in order to align positions of the laminate structure 1 and the stamper 30. The first press plate 20 and the second press plate 22 may be provided with jigs 27a to 27d to hold the laminate structure 1 and the stamper 30, respectively, as shown in FIG. 2. Moreover, as shown in FIG. 3, a vacuum chuck 28a for sucking the laminate structure 1 may be provided on the surface of the first press plate 20, and a vacuum chuck 28b for sucking the stamper 30 may be provided on the surface of the second press plate 22. A non-transparent pressure-resistant material, such as stainless steel, iron (Fe) and ceramic, may be used for the first press plate 20 and the second press plate 22.

The stamper 30 is a model for transferring projections and recesses in the shape of tracks, dots and the like for a magnetic recording medium, onto the laminate structure 1. The surface of the stamper 30 has a fine pattern of projections and recesses made by a master processing disk formed by electron beam lithography or the like. The cross section of FIG. 1 shows four projections. In practice, however, the cross section includes one to five million projections, each having a width of about 30 to 100 nm, a pitch of about 100 to 200 nm, and a height of about 30 to 100 nm. Note that, in a plan view, there may in fact be only one spiral projection. The surface of the stamper 3, opposite to the surface of the same having the pattern of projections and recesses is preferably a plane so as to be in close contact with the bottom surface of the second press plate 22. At the center of the surface of the stamper 30, there is a second fitting hole 32 fitting with the alignment column 24 of the first press plate 20 so as to align the positions of the laminate structure 1 and the stamper 30. The stamper 30 can be made of a non-transparent material, such as nickel (Ni) and Fe, be resistant to a pressure of 10 MPa or higher but not exceeding 300 MPa, preferably a pressure of 50 MPa or higher but not exceeding 280 MPa, and more preferably a pressure of 150 MPa or higher but not exceeding 250 MPa. Since the distortions of the resist film 12 and the stamper 30 cannot be offset at a pressure of 10 MPa or lower, the pattern of projections and recesses cannot be transferred uniformly onto the entire surface of the resist film 12. With a pressure of 50 MPa or higher, the pattern of projections and recesses is transferred uniformly onto the entire surface of the resist film 12 without fail. Further, at a pressure at or above 280 MPa the resist film will begin to peel, and is thus too high. In particular a pressure at or above 300 MPa has an increased likelihood of distorting the stamper and breaking the substrate 10.

Figure 4:
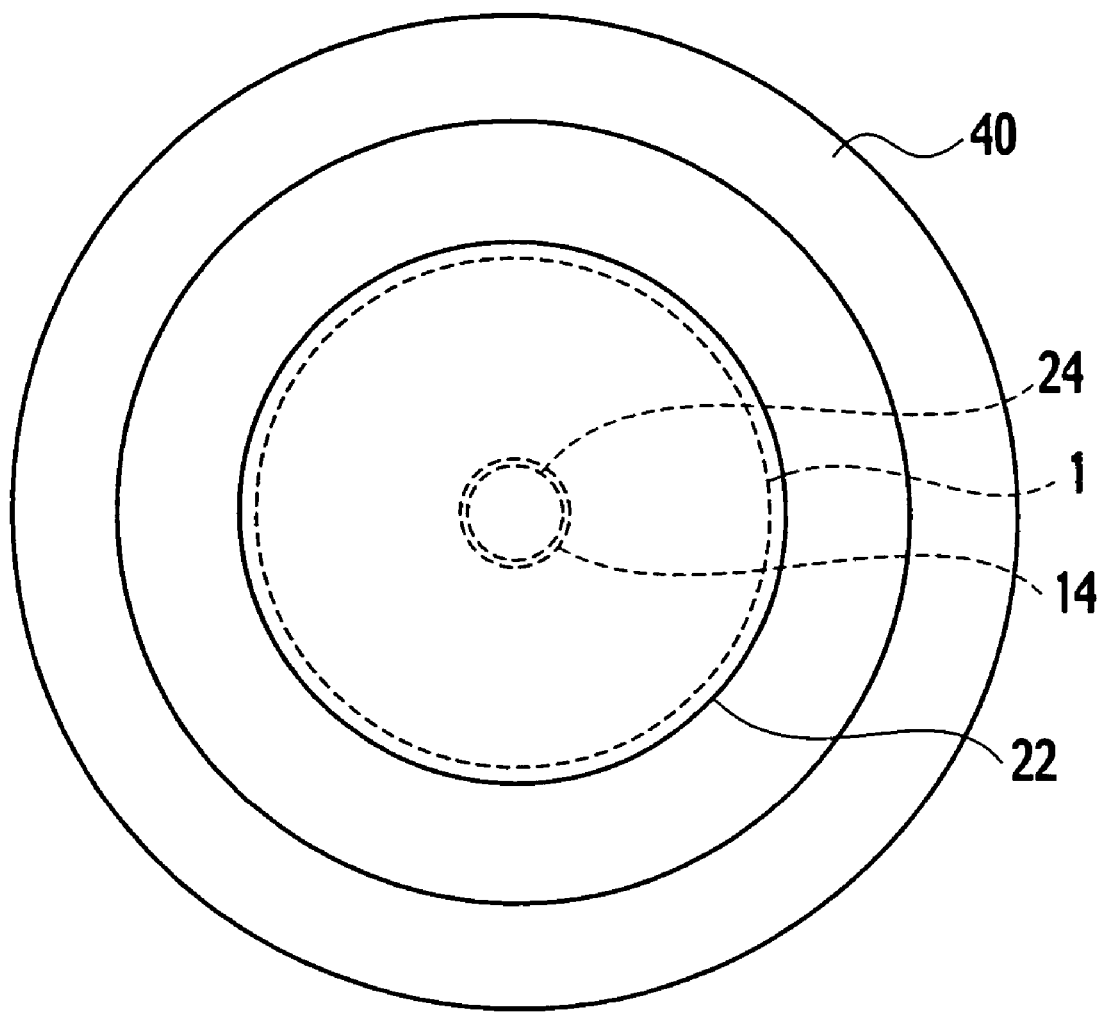
FIG. 4 is a schematic plan view showing an imprint apparatus according to the first embodiment of the present invention.

The light source 40 is level with and on the same plane as the laminate structure 1 so that UV light reaches the laminate structure 1 from a clearance between the first press plate 20 and second press plate 22 facing each other while they are being pressed. Further, as shown in FIG. 4, the light source 40 is a doughnut-shaped lamp having an inner diameter surrounding the first press plate 20 and the second press plate 22. The light source 40 is placed to be concentric with the first press plate 20 and the second press plate 22. A halogen lamp, a mercury lamp or the like, which emits UV light, is used as the light source 40.

Hereinbelow, a method of imprinting of the imprint apparatus 2a according to the first embodiment of the present invention is described in reference to FIGS. 5 to 9.

Figure 5:
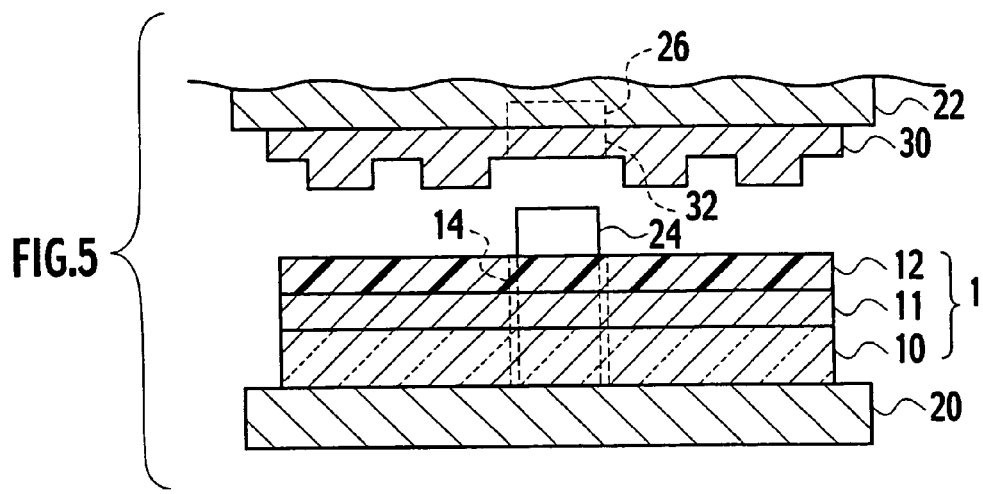
FIG. 5 is a sectional view showing a method for imprinting according to the first embodiment of the present invention.

(A) Prepared is the doughnut-shaped substrate 10 having, for example, a diameter of 65 mm, a thickness of 0.6 mm, and the through hole 14 at the center with an inner diameter of 20 mm. The magnetic film 11 and UV-curing resist film 12 are sequentially laminated on the substrate 10, thus forming the laminate structure 1. The magnetic film 11 is provided on the substrate 10 by spattering, for example. The resist film 12 is obtained by applying photoresist onto the magnetic film 11 by spin coating, for example. Here, the film thickness of the resist film 12 is 100 nm. Thereafter, as shown in FIG. 5, the laminate structure 1 is mounted on the first press plate 20 having a diameter of 80 mm while fitting the alignment column 24 of the first press plate 20 with the through hole 14. The alignment column 24 is designed to be slightly smaller than the through hole 14 to create a small clearance therebetween, and the diameter of the alignment column 24 is set to be 19.98 mm.

(B) Prepared is the doughnut-shaped stamper 30 having, for example, a diameter of 80 mm, a thickness of 0.3 mm, and the fitting hole 32 open at the center with an inner diameter of 20 mm. Thereafter, as shown in FIG. 5, the stamper 30 is fixed to the bottom surface of the second press plate 22 having a diameter of 80 mm, so that the surface of the stamper 30 where projections and recesses are formed, and the laminate structure 1 face each other. At this time, the stamper 30 is placed so that the first and second fitting holes 26 and 32 provided in the second press plate 22 and stamper 30, respectively, meet each other.

Figure 6:
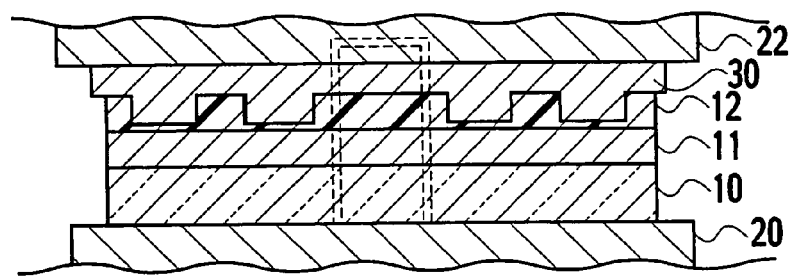
FIG. 6 is a sectional process view after the process shown in FIG. 5 for explaining an example of a method for imprinting according to the first embodiment of the present invention.
Figure 7:
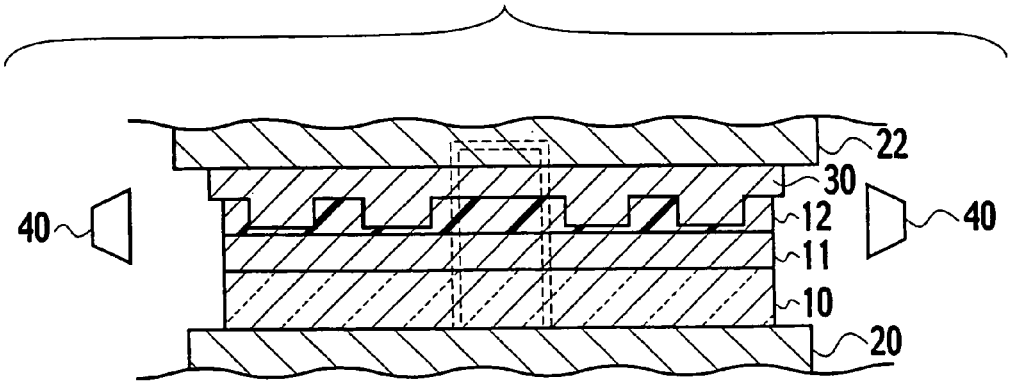
FIG. 7 is a sectional process view after the process shown in FIG. 6 for explaining an example of a method for imprinting according to the first embodiment of the present invention.

(C) As shown in FIG. 6, the first press plate 20 and second press plate 22 are pressed by a pressurizer (not shown) such as a hydraulic cylinder, in the atmosphere at room temperature and atmospheric pressure, so that a portion of the alignment column 24 projecting from the laminate structure 1, is fit into the first and second fitting holes 26 and 32. Thus, laminate structure 1 is pressed, and a pattern of projections and recesses of the surface of stamper 30 is transferred onto the laminate structure 1. The laminate structure 1 is pressed, for example, for one minute at a pressure of 100 MPa. 30 seconds after commencing pressing, the light source 40 emits UV light onto the resist film 12 from the side of the laminate structure 1 though a clearance between the first press plate 20 and second press plate 22, as shown in FIG. 7. As a result, the resist film 12 is cured.

Figure 8:
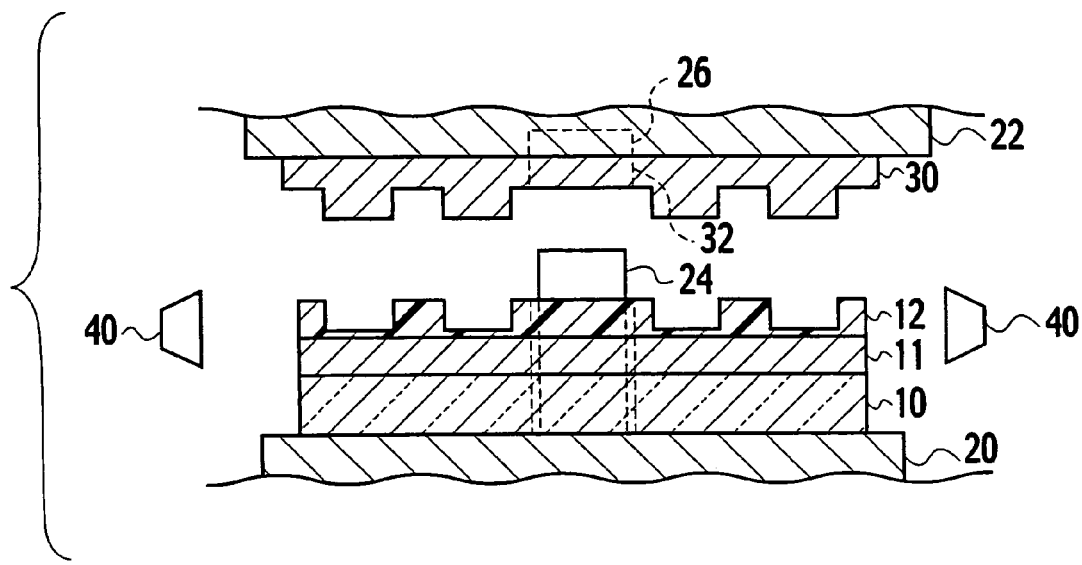
FIG. 8 is a sectional process view after the process shown in FIG. 7 for explaining an example of a method for imprinting according to the first embodiment of the present invention.

(D) After pressing is finished, the vacuum chucks (not shown) provided in the first press plate 20 and the second press plate 22 are activated so that the laminate structure 1 and stamper 30 are absorbed onto the first press plate 20 and second press plate 22, respectively, as shown in FIG. 8. Thereafter, the first press plate 20 and the second press plate 22 are moved away from each other, therein separating the imprinted laminate structure 1 and the stamper 30.

Figure 9:
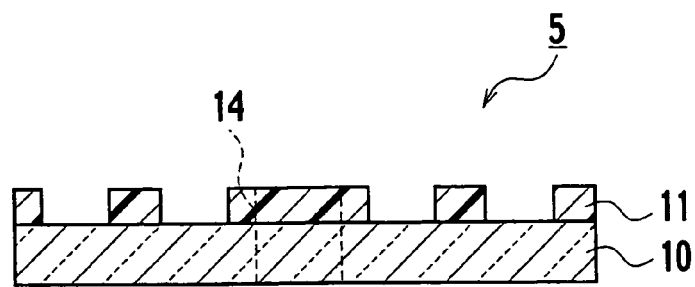
FIG. 9 is a sectional process view after process shown in FIG. 8 for explaining an example of a method for imprinting according to the first embodiment of the present invention.

(E) The imprinted laminate structure 1 is moved from the imprint apparatus 2a to a processing apparatus such as a reactive ion etching (RIE) apparatus and an argon ion milling apparatus. Once the laminate structure 1 is moved to the processing apparatus, the entire surface of the UV-cured resist film 12, onto which projections and recesses are transferred by imprinting, is etched by RIE until the surface of the magnetic film 11 is exposed. Thereafter, by using the resist film 12 as a mask, the magnetic film 11 is etched by argon ion milling, thus obtaining a magnetic recording media 5 having a patterned media in which neighboring recording tracks are physically isolated from each other, as shown in FIG. 9.

With the imprint apparatus 2a according to the first embodiment, even where there are distortions of the laminate structure 1 and stamper 30, the distortions are corrected by high pressure pressing method, enabling uniform imprinting of a large area. Therefore, the magnetic recording media 5 having a patterned media can be fabricated with high throughput. Further, with the imprint apparatus 2a according to the first embodiment, pressing is performed at a high pressure. Hence, a transparent material, such as quartz, having strength problems is not used, but a non-transparent pressure-resistant material is used for all parts of the imprint apparatus 2a. Even so, UV light can be emitted from the clearance between the first press plate 20 and second press plate 22 facing each other when they are pressed. Therefore, there are no variations in the resist film 12 over time.

Second Embodiment

Figure 10:
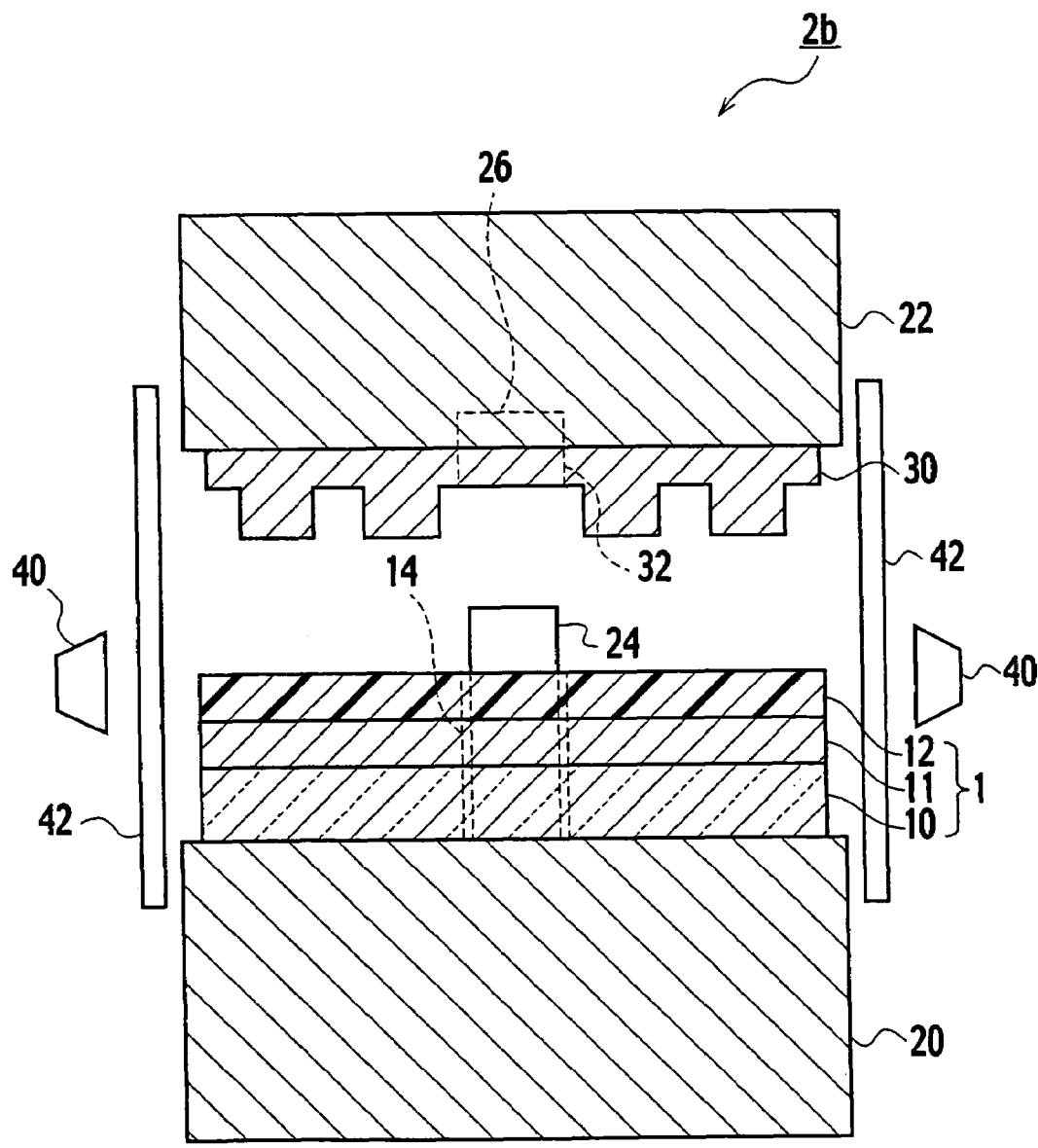
FIG. 10 is a schematic sectional view showing an imprint apparatus according to a second embodiment of the present invention.

As shown in FIG. 10, an imprint apparatus 2b according to a second embodiment of the present invention is different from the imprint apparatus 2a shown in FIG. 1 in that the imprint apparatus 2b has a cylinder-shaped light shielding plate 42. The rest of the imprint apparatus 2b is substantially the same as the imprint apparatus 2a shown in FIG. 1, and thus duplicated descriptions will be omitted.

The light shielding plate 42 is disposed between the laminate structure 1 and the light source 40. The light shielding plate 42 blocks UV light emitted from the light source 40 from reaching the laminate structure 1, and may have any shape as long as it can control the emission of UV light onto the laminate structure 1. The light shielding plate 42 functions like an openable shutter by moving in a vertical direction or the like. Therefore the light shielding plate 42 is able to open and shut.

Hereinbelow, a method of imprinting of the imprint apparatus 2b according to the second embodiment of the present invention is described in reference to FIGS. 11 to 15.

Figure 11:
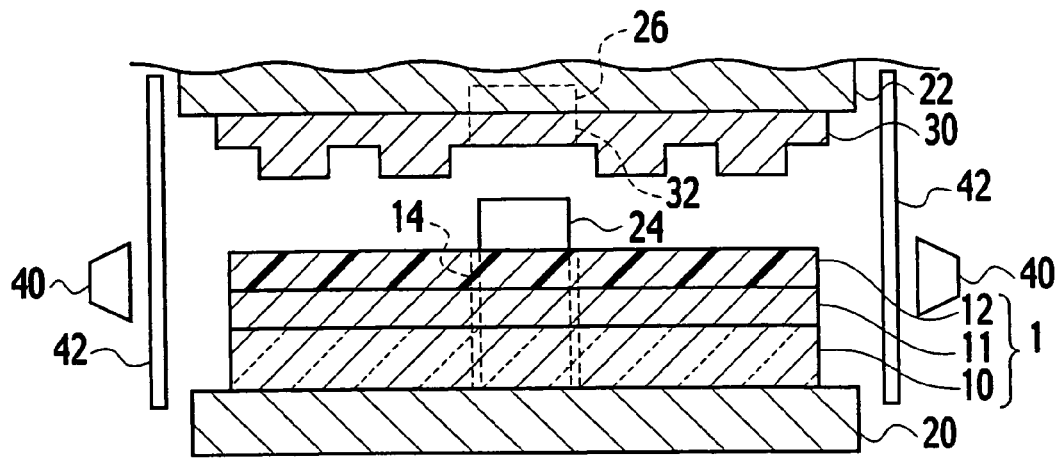
FIG. 11 is a sectional view showing a method for imprinting according to the second embodiment of the present invention.

(A) Prepared is the doughnut-shaped substrate 10 having, for example, a diameter of 65 mm, a thickness of 0.6 mm, and the through hole 14 at the center with an inner diameter of 20 mm. The magnetic film 11 and resist film 12 are sequentially laminated on the substrate 10, thus forming the laminate structure 1. The magnetic film 11 is provided on the substrate 10 by spattering, for example. The resist film 12 is obtained by applying photoresist onto the magnetic film 11 by spin coating, for example. Here, the film thickness of the resist film 12 is 100 nm. Thereafter, as shown in FIG. 11, the laminate structure 1 is mounted on the first press plate 20 having a diameter of 80 mm while fitting to the alignment column 24 of the first press plate 20 with the through hole 14. The alignment column 24 is designed to be slightly smaller than the through hole 14 to create a small clearance therebetween, and the diameter of the alignment column 24 is set to be 19.98 mm.

(B) Prepared is the doughnut-shaped stamper 30 having, for example, a diameter of 80 mm, a thickness of 0.3 mm, and the fitting hole 32 open at the center with an inner diameter of 20 mm. Depth of the recesses of the projections and recesses formed on stamper 30 is 100 nm. Thereafter, as shown in FIG. 11, the stamper 30 is fixed to the bottom surface of the second press plate 22 having a diameter of 80 mm, so that the surface of the stamper 30, where the projections and recesses are formed, and the laminate structure 1 face each other. At this time, the stamper 30 is placed so that the first and second fitting holes 26 and 32 provided in the second press plate 22 and stamper 30, respectively, meet each other. By using the light shielding plate 42, UV light from the light source 40 does not reach in the laminate structure 1, and so the illumination of the light source 40 is stabilized.

Figure 12:
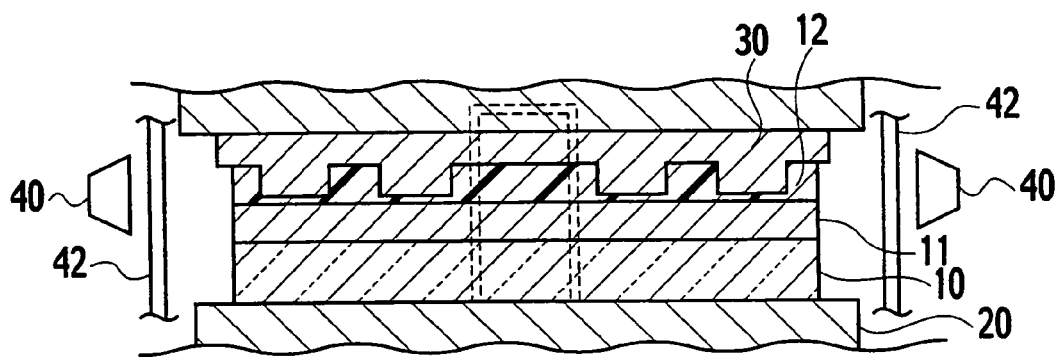
FIG. 12 is a sectional process view after the process shown in FIG. 11 for explaining an example of a method for imprinting according to the second embodiment of the present invention.
Figure 13:
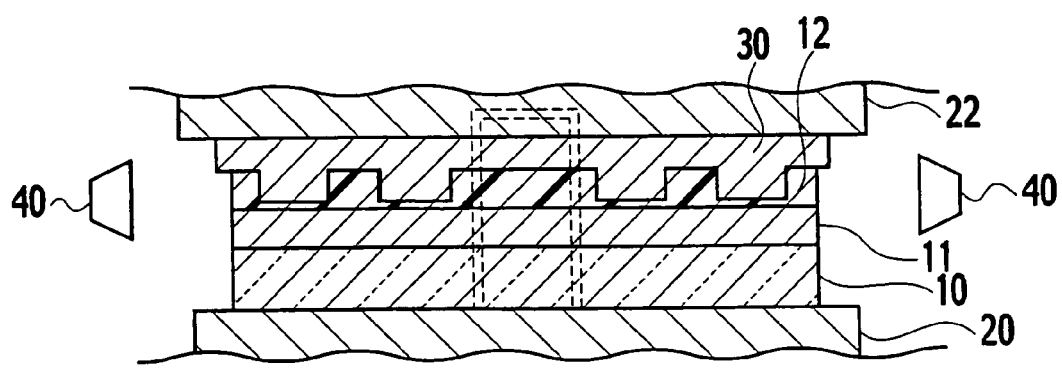
FIG. 13 is a sectional process view after the process shown in FIG. 12 for explaining an example of a method for imprinting according to the second embodiment of the present invention.

(C) As shown in FIG. 12, the first press plate 20 and second press plate 22 are pressed by a pressurizer (not shown) such as a hydraulic cylinder, in the atmosphere at room temperature and atmospheric pressure, so that a portion of the alignment column 24, projecting from the laminate structure 1, is fit into the first and second fitting holes 26 and 32. Thus, the laminate structure 1 is pressed. The laminate structure 1 is pressed, for example, for one minute at a pressure of 100 MPa. Hereupon, because the light shielding plate 42 has been shut, laminate structure 1 is not irradiated by UV light. 30 seconds after commencing pressing, the light source 40 emits UV light onto the resist film 12 from the side of the laminate structure 1 by moving light shielding plate 42 to the upper side or the lower side, as shown in FIG. 13. As a result, the resist film 12 is cured.

Figure 14:
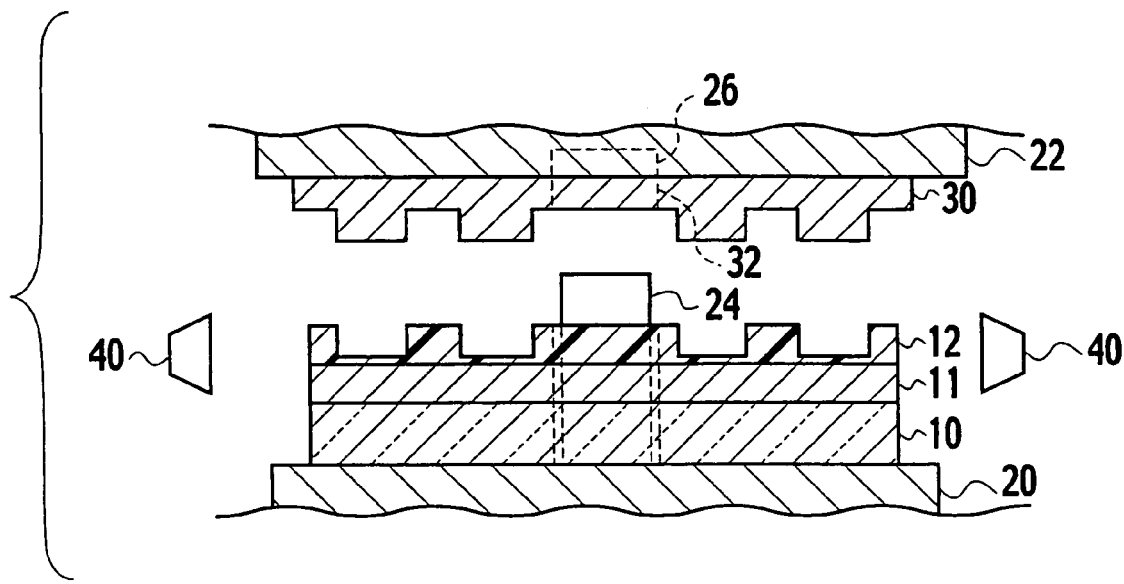
FIG. 14 is a sectional process view after the process shown in FIG. 13 for explaining an example of a method for imprinting according to the second embodiment of the present invention.

(D) After curing is finished, the vacuum chucks (not shown) provided in the first press plate 20 and second press plate 22 are activated so that the laminate structure 1 and stamper 30 are absorbed onto the first press plate 20 and second press plate 22, respectively, as shown in FIG. 14. Thereafter, the first press plate 20 and second press plate 22 are moved away from each other, thus separating the imprinted resist film 12 and stamper 30.

Figure 15:
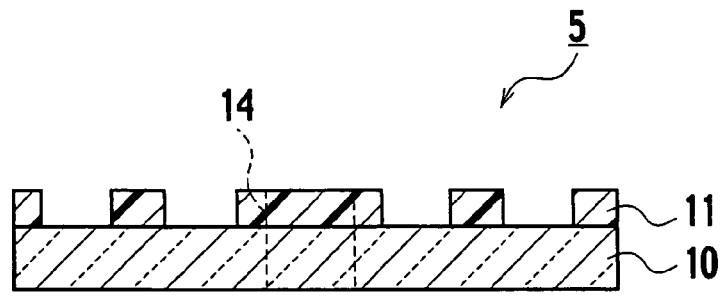
FIG. 15 is a sectional process view after the process shown in FIG. 14 for explaining an example of a method for imprinting according to the second embodiment of the present invention.

(E) The imprinted laminate structure 1 is moved from the imprint apparatus 2a to a processing apparatus such as an RIE apparatus and an argon ion milling apparatus. Once the laminate structure 1 is moved to the processing apparatus, the entire surface of the UV-cured resist film 12, onto which projections and recesses are transferred by imprinting, is etched by RIE until the surface of magnetic film 11 is exposed. Thereafter, by using the resist film 12 as a mask, the magnetic film 11 is etched by argon ion milling, thus obtaining a magnetic recording media 5 having a patterned media in which neighboring recording tracks are physically isolated from each other, as shown in FIG. 15.

In the imprint apparatus 2b according to the second embodiment of the present invention, the light shielding plate 42 is provided. Thus, emission of UV light onto the laminate structure 1 can be controlled by moving the light shielding plate 42. In other words, since the light shielding plate 42 exists, the resist film 12 before imprinting is not cured even where the light source 40 is lighted through the entire period of the imprinting process. Since the light source 40 can be remained lighted, stable UV light can be obtained from the light source 40, such as a halogen lamp and mercury lamp, which takes time until illumination of UV light becomes stable after commencing lighting. Moreover, waiting time for obtaining stable UV light is no longer required, thus improving throughput. In addition, the light source 40 is no longer turned on and off repeatedly, thus extending the life of the light source 40.

Other Embodiments

Figure 16:
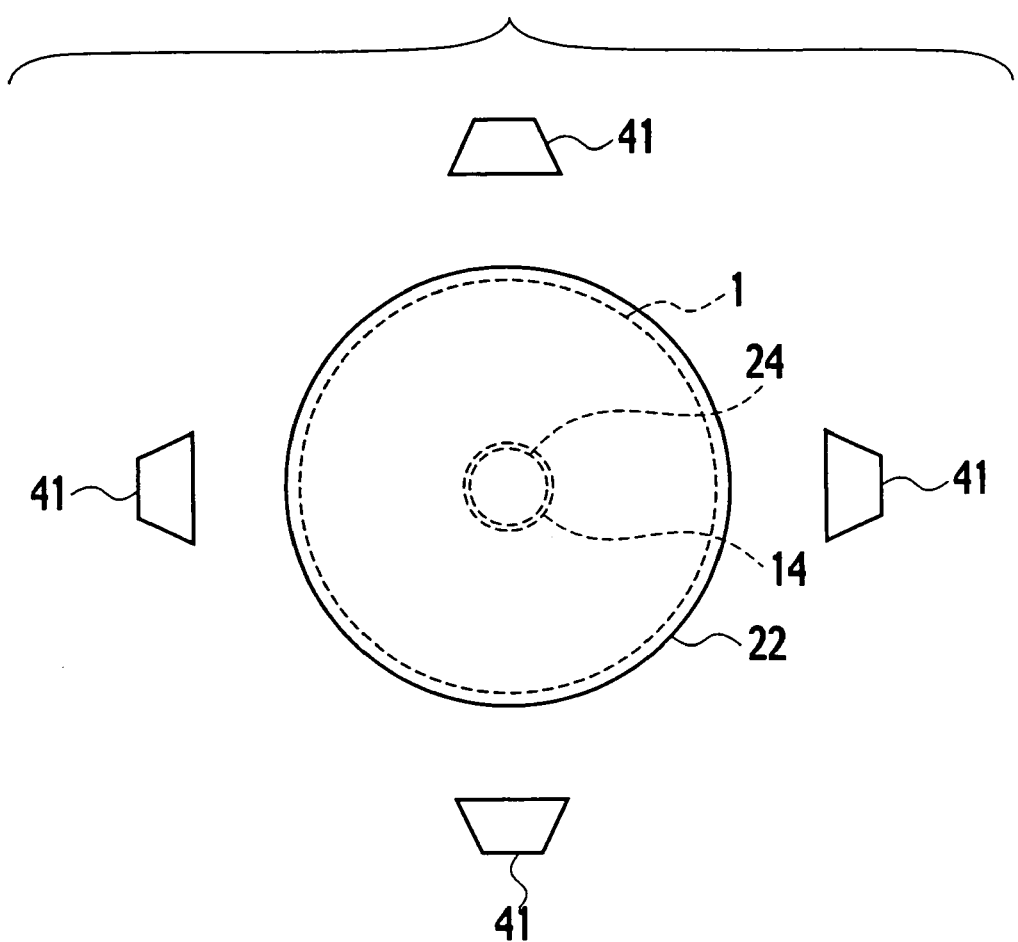
FIG. 16 is a schematic plan view showing an imprint apparatus according to other embodiment of the present invention.

It was described, regarding the imprint apparatus 2a according to the first embodiment for example, that the light source 40 is doughnut-shaped with an inner diameter enabling the light source 40 to surround the laminate structure 1, first press plate 20 and the second press plate 22. However, as shown in FIG. 16, a plurality of light sources 41 may be interspersed, for example, along the circumference of the laminate structure 1 shown in FIG. 4, between the surfaces of the first press plate 20 and the second press plate 20 facing each other so that UV light reaches the laminate structure 1 from the clearance between the first press plate 20 and the second press plate 22 facing each other when they are pressed.

Figure 17:
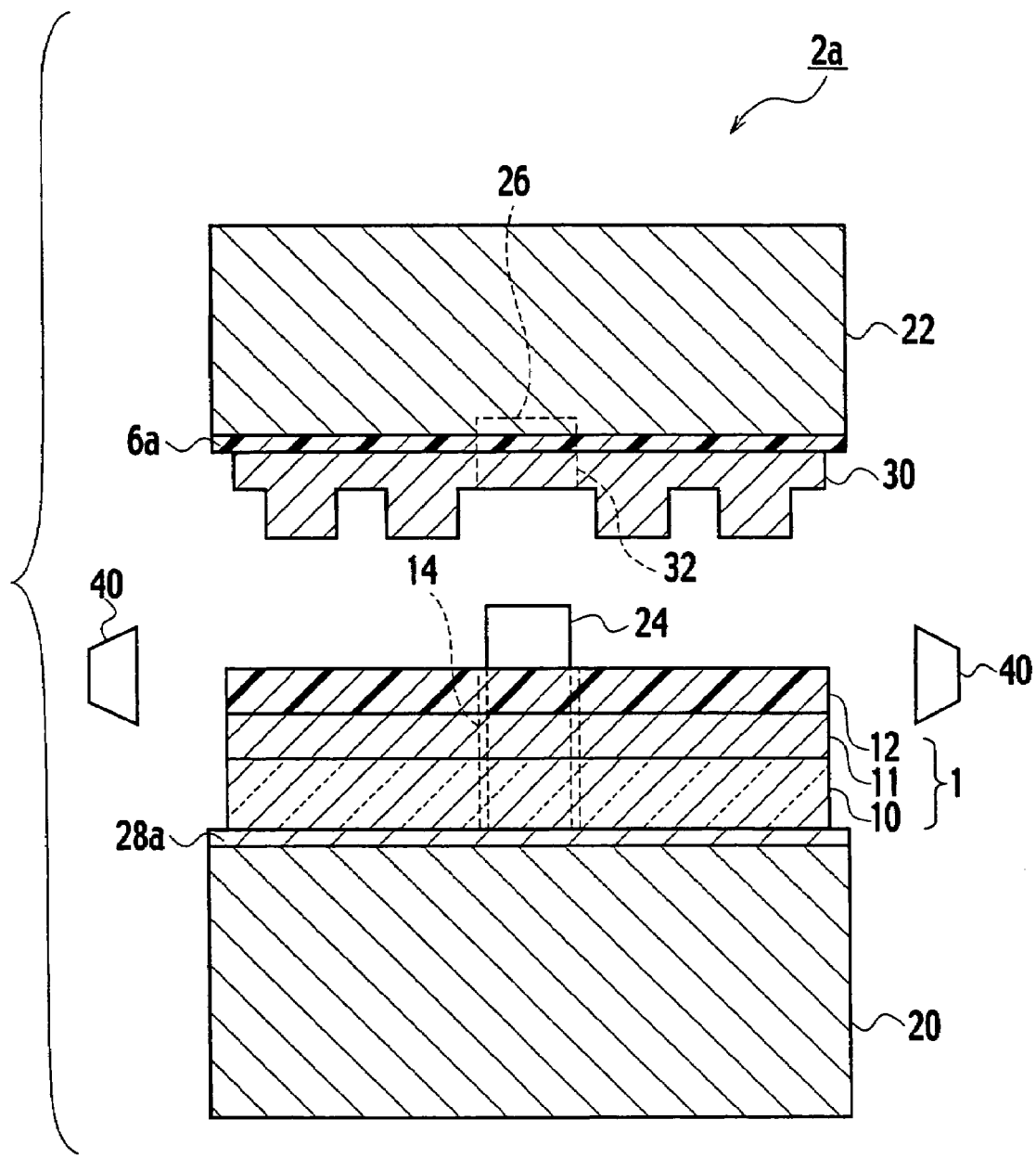
FIG. 17 is a schematic sectional view showing an imprint apparatus according to other embodiment of the present invention.
Figure 18:
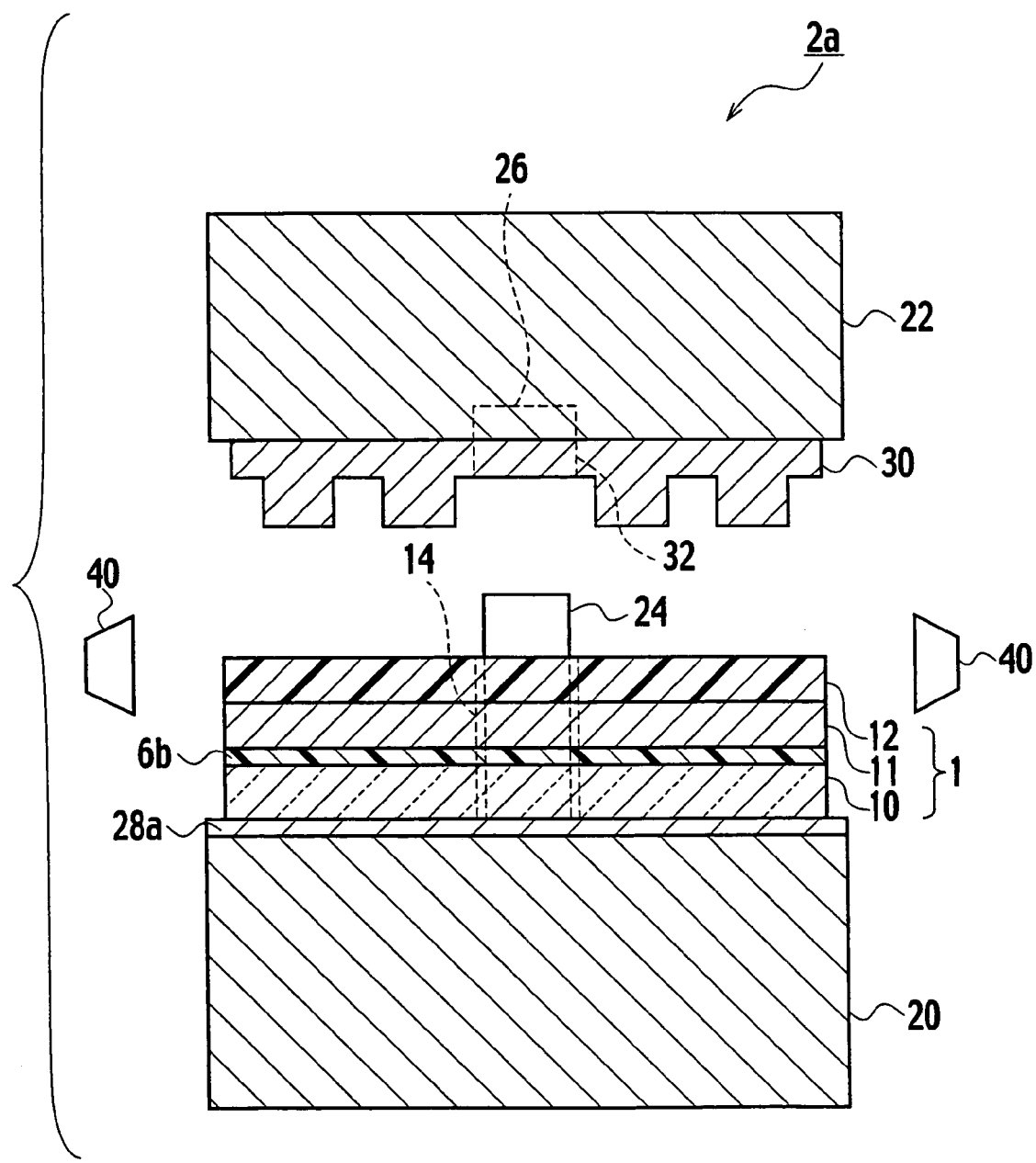
FIG. 18 is another schematic sectional view showing an imprint apparatus according to other embodiment of the present invention.

Further, on the imprint apparatus 2a according to the first embodiment, a cushion layer 6a may be placed between the second press plate 22 and the stamper 30 as shown in FIG. 17. Alternatively, a cushion layer 6b may be placed between the substrate 10 and the magnetic film 11 as shown in FIG. 18. By placing either the cushion layer 6a or the cushion layer 6b at one of the above places, breakage of parts due can be prevented in a simple manner. A polymer sheet made of polyethylene terephthalete (PET) or the like is used as the cushion layers 6a and 6b.

Moreover, it was described that a non-transparent material such as metal is used for constituents of the imprint apparatuses 2a and 2b according to the first and second embodiments. However, a transparent material can be used as long as it is resistant to a pressure of 10 MPa or higher but not exceeding 300 MPa.

Various modifications will become possible for those skilled in the art after receiving the teachings of the present disclosure without departing from the scope thereof.

What is claimed is:

1. An imprint apparatus configured to press a laminate structure in which a magnetic film and a resist film are sequentially laminated on a substrate, said imprint apparatus comprising:
   a first press plate configured to mount the laminate structure;
   a second press plate facing the first press plate adapted for sandwiching the laminate structure with the first press plate;
   a stamper made of a non-transparent material resistant to a pressure more than 10 MPa and placed on a surface of the second press plate facing the first press plate, the stamper has projections and recesses configured to be transferred onto the resist film; and
   a light source configured to be disposed on the same plane as the laminate structure, and to be oriented so that the light source can emit UV light onto and cure the resist film after commencement of the pressing of the laminate structure with the first press plate and the second press plate to form an imprinted laminate structure,
   wherein the stamper is configured to be separable from the imprinted laminate structure.

2. The imprint apparatus of claim 1, wherein the stamper is made of a transparent material.

3. The imprint apparatus of claim 1, wherein the light source is configured to surround the laminate structure.

4. The imprint apparatus of claim 1, wherein a plurality of the light sources are disposed, configured to be interspersed along the circumference of the laminate structure.

5. The imprint apparatus of claim 1, wherein the first press plate and second press plate are made of one of stainless steel, iron and ceramic.

6. The imprint apparatus of claim 1, further comprising a cushion layer disposed between the second press plate and stamper.

7. The imprint apparatus of claim 1, further comprising a cushion layer disposed between the first press plate and the laminate structure.

8. A method for imprinting, comprising:
   mounting a laminate structure having a magnetic film, a resist film and a substrate on a first press plate;
   placing a stamper on a surface of a second press plate facing the resist film, the stamper has projections and recesses;
   transferring a pattern of the projections and recesses of the stamper onto the laminate structure by pressing the laminate structure;
   curing the resist film by emitting UV light onto the resist film from the side of the laminate structure during the press;
   separating the resist film and the stamper in a state where the stamper is attached to the second press plate after curing; and
   obtaining a magnetic recording media having a patterned media by etching the magnetic film using the resist film as a mask.

* * * * *